United States Patent
Park et al.

(10) Patent No.: US 10,411,175 B2
(45) Date of Patent: Sep. 10, 2019

(54) LIGHT EMITTING ELEMENT PACKAGE AND METHOD OF MANUFACTURING THE SAME

(71) Applicant: SAMSUNG ELECTRONICS CO., LTD., Suwon-si, Gyeonggi-Do (KR)

(72) Inventors: Il Woo Park, Suwon (KR); Cheol Jun Yoo, Hwaseong (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/391,283

(22) Filed: Dec. 27, 2016

(65) Prior Publication Data
US 2017/0110636 A1    Apr. 20, 2017

Related U.S. Application Data

(63) Continuation of application No. 13/800,824, filed on Mar. 13, 2013, now abandoned.

(30) Foreign Application Priority Data

Mar. 14, 2012  (KR) .......................... 10-2012-0026068
Jan. 4, 2013   (KR) .......................... 10-2013-0000946

(51) Int. Cl.
    *H01L 21/56*   (2006.01)
    *H01L 33/38*   (2010.01)
    (Continued)

(52) U.S. Cl.
    CPC .............. *H01L 33/60* (2013.01); *H01L 33/38* (2013.01); *H01L 33/46* (2013.01); *H01L 33/50* (2013.01);
    (Continued)

(58) Field of Classification Search
    CPC ....... H01L 33/60; H01L 33/62; H01L 33/505; H01L 33/46; H01L 33/38
    See application file for complete search history.

(56) References Cited

U.S. PATENT DOCUMENTS 6,878,973 B2    4/2005  Lowery et al.
7,304,326 B2    12/2007 Suehiro et al.
(Continued)

FOREIGN PATENT DOCUMENTS

JP    2007-019096     1/2007
JP    2008-047832     2/2008
KR    10-2011-0099512 9/2011

OTHER PUBLICATIONS

Office Action (in Korean) dated Sep. 12, 2018 in corresponding Korean Appl. No. KR 10-2013-0000946 (6 pages).

*Primary Examiner* — Yu Chen
*Assistant Examiner* — Vincent Wall
(74) *Attorney, Agent, or Firm* — F. Chau & Associates, LLC

(57) ABSTRACT

There is provided a light emitting element package including: a light emitting laminate having a structure in which semiconductor layers are laminated and having a first main surface and a second main surface opposing the first main surface; a terminal unit disposed on an electrode disposed on the second main surface; a molded unit disposed on the second main surface of the light emitting laminate and allowing a portion of the terminal unit to be exposed; and a wavelength conversion unit disposed on the first main surface of the light emitting laminate.

15 Claims, 14 Drawing Sheets

(51) Int. Cl.
　　　*H01L 33/46*　　　(2010.01)
　　　*H01L 33/50*　　　(2010.01)
　　　*H01L 33/56*　　　(2010.01)
　　　*H01L 33/60*　　　(2010.01)
　　　*H01L 33/62*　　　(2010.01)

(52) U.S. Cl.
　　　CPC ............ *H01L 33/505* (2013.01); *H01L 33/62* (2013.01); *H01L 21/568* (2013.01); *H01L 33/56* (2013.01); *H01L 2224/04105* (2013.01); *H01L 2224/13* (2013.01); *H01L 2224/32225* (2013.01); *H01L 2224/73267* (2013.01); *H01L 2224/94* (2013.01); *H01L 2224/96* (2013.01); *H01L 2924/18162* (2013.01); *H01L 2933/0058* (2013.01); *H01L 2933/0066* (2013.01)

(56) References Cited

U.S. PATENT DOCUMENTS

| | | | | |
|---|---|---|---|---|
| 8,288,843 B2* | 10/2012 | Kojima | ................ | H01L 33/382 257/620 |
| 8,350,285 B2* | 1/2013 | Sugizaki | ............ | H01L 33/0095 257/98 |
| 8,502,260 B2* | 8/2013 | Sugizaki | ............ | H01L 33/0079 257/99 |
| 8,680,548 B2 | 3/2014 | Gotoda et al. | | |
| 8,692,279 B2* | 4/2014 | Izuka | ...................... | H01L 33/38 257/91 |
| 8,710,531 B2* | 4/2014 | Li | ........................ | H01L 33/0004 257/98 |
| 8,729,592 B2* | 5/2014 | Iduka | .................... | H01L 33/385 257/778 |
| 8,766,310 B2* | 7/2014 | Kojima | .................... | H01L 33/20 257/79 |
| 8,860,075 B2* | 10/2014 | Izuka | ...................... | H01L 33/38 257/750 |
| 8,866,179 B2* | 10/2014 | Sugizaki | ................. | H01L 33/44 257/99 |
| 8,963,189 B2* | 2/2015 | Akimoto | ................ | H01L 27/153 257/100 |
| 2006/0138443 A1* | 6/2006 | Fan | ........................ | H01L 33/56 257/100 |
| 2010/0320479 A1* | 12/2010 | Minato | .................... | H01L 33/56 257/88 |
| 2011/0068359 A1* | 3/2011 | Yahata | .................. | H01L 33/382 257/98 |
| 2011/0198609 A1* | 8/2011 | Huang | .................. | H01L 33/382 257/76 |
| 2012/0302124 A1* | 11/2012 | Imazu | ................... | H01L 33/486 445/58 |
| 2013/0240934 A1 | 9/2013 | Park et al. | | |

\* cited by examiner

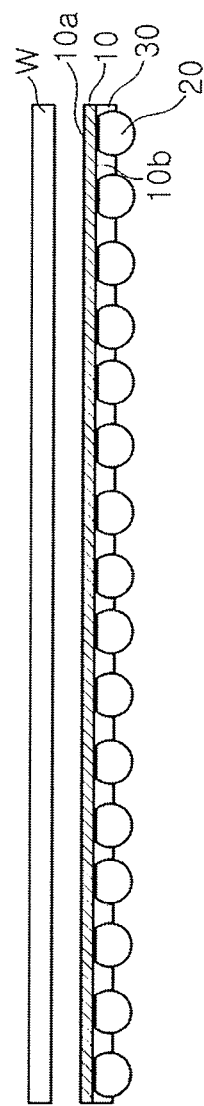
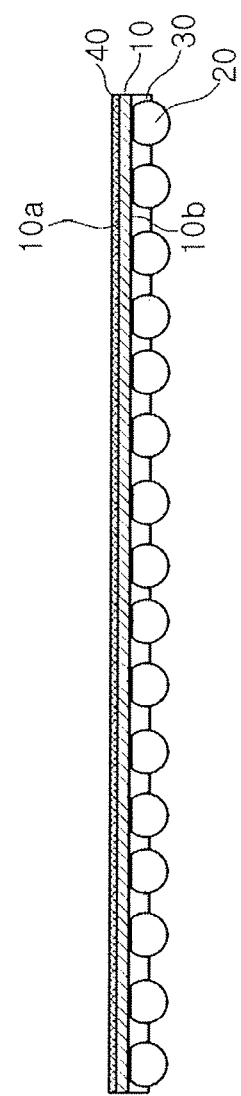

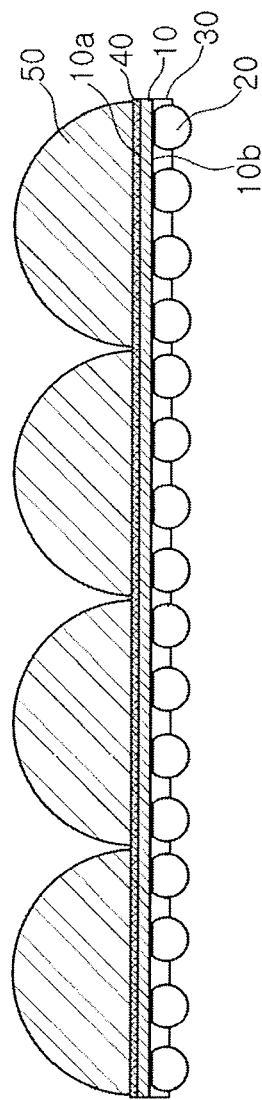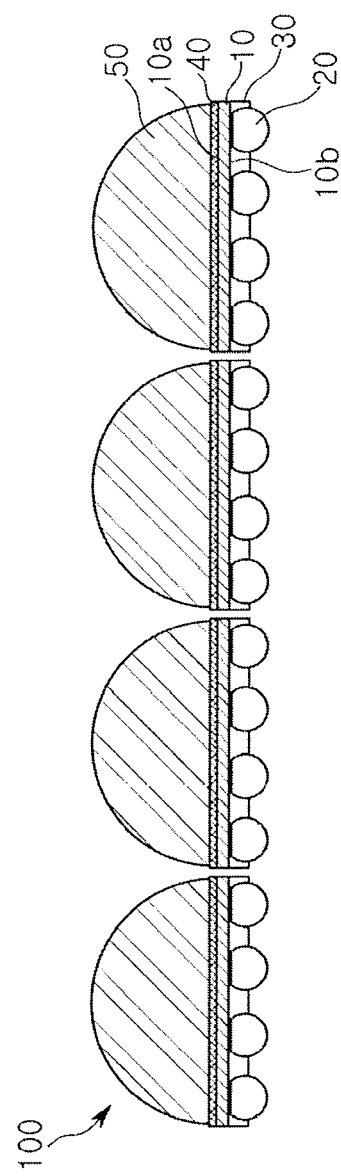

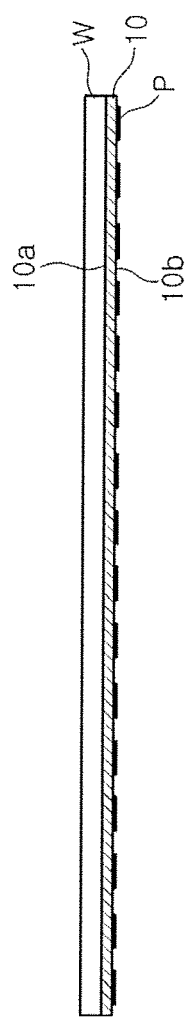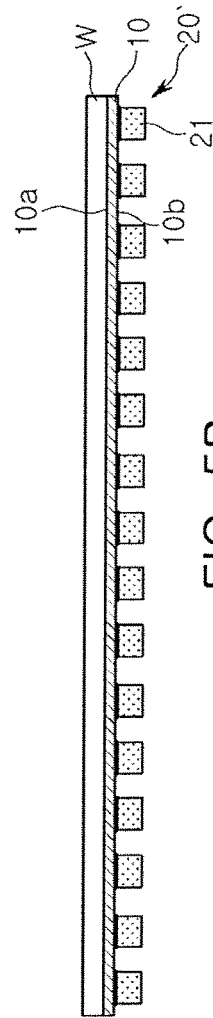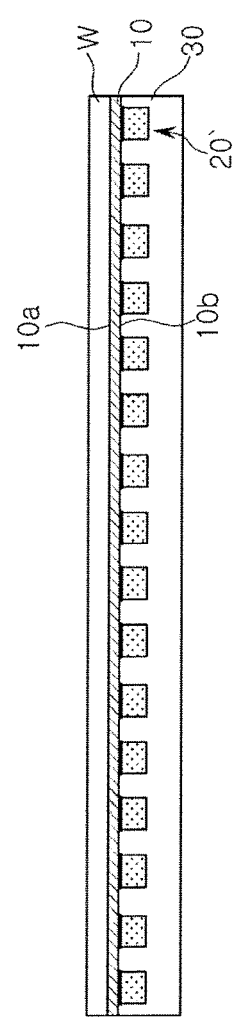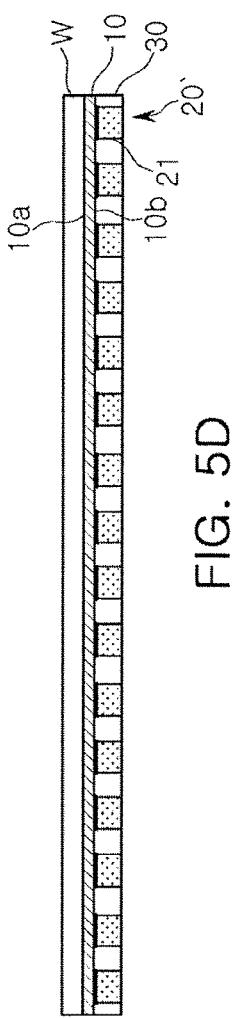

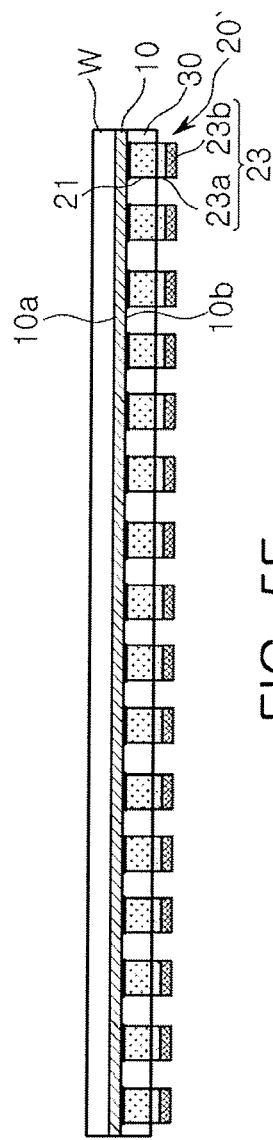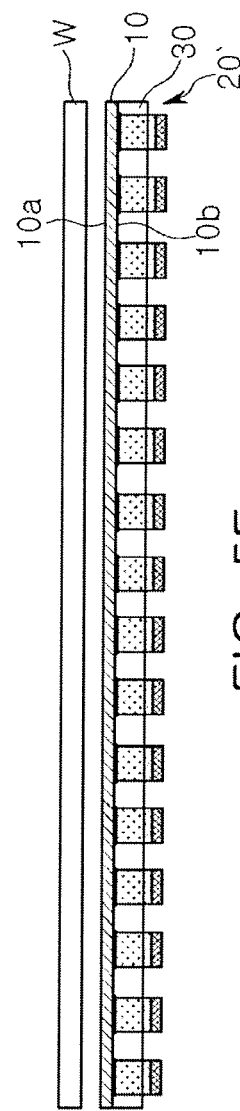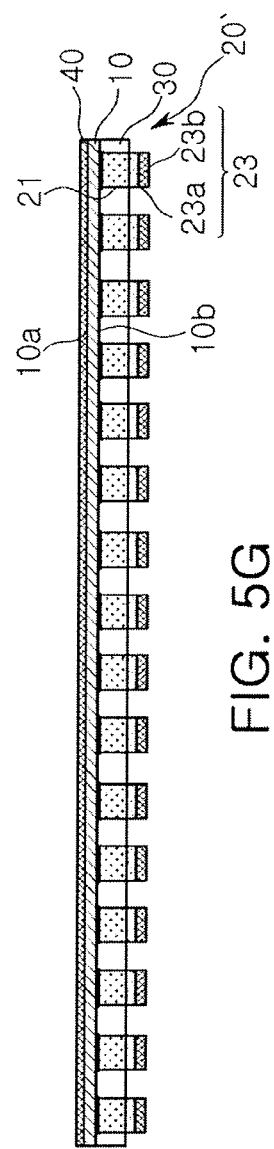

LIGHT EMITTING ELEMENT PACKAGE AND METHOD OF MANUFACTURING THE SAME

CROSS-REFERENCE TO RELATED APPLICATIONS

This application is a continuation of U.S. patent application Ser. No. 13/800,824, filed on Mar. 13, 2013, which claims priority to Korean Patent Application No. 10-2012-0026068 filed on Mar. 14, 2012, and No. 10-2013-0000946 filed on Jan. 4, 2013 in the Korean Intellectual Property Office, the disclosure of which is incorporated by reference herein in its entirety.

BACKGROUND OF THE INVENTION

Field of the Invention

The inventive concept relates to a light emitting element package and a method of manufacturing the same.

Description of the Related Art

A light emitting diode (LED) is a type of a luminous element (or light emitting element) capable of implementing light in various colors by forming a light emission source through a PN junction in a compound semiconductor.

The uses of LEDs have extended from a signal light to general illumination devices, and in order to emit a larger quantity of light, LEDs have tended to have enhanced light efficiency and larger sizes. Meanwhile, as the general purposes of LEDs have extended to be used for illumination devices in various sectors, a size of a package is required to be reduced to obtain a degree of freedom for design of illumination devices for a range of respective purposes.

However, in case of a premolded structure such as a conventional light emitting element package structure in which an LED is attached to a package body or in the case of a package structure in which an LED chip is attached to a ceramic substrate, or the like, there is a limitation in reducing a size, resulting in a limitation in a degree of freedom available in the designing of an illumination device.

A light emitting element package is mounted on a circuit board, and when an electrical signal for driving a light emitting element is applied to an electrode of the light emitting element, the light emitting element emits light. Here, heat generated by the light emitting element is dissipated outwardly through the circuit board, and in this case, if heat generated by the light emitting element is not smoothly dissipated outwardly, reliability of the light emitting element package may be degraded, or the like.

SUMMARY OF THE INVENTION

In the art, a light emitting element package and a manufacturing method thereof capable of maximizing a degree of freedom in a design of an illumination device by implementing an ultra-small package are required.

Also, a light emitting element package and a manufacturing method thereof capable of effectively dissipating heat generated by a light emitting element outwardly by mounting a light emitting element package directly on a wiring pattern, rather than on a circuit board, to thus simplify a heat transmission path, are required.

In addition, a light emitting element package and a manufacturing method thereof capable of reducing the cost of production and enhancing productivity by simplifying a structure of a light emitting element package are required.

According to an aspect of the inventive concept, there is provided a light emitting element package including: a light emitting laminate having a structure in which semiconductor layers are laminated and having a first main surface and a second main surface opposing the first main surface; a terminal unit disposed on at least one electrode disposed on the second main surface; a molded unit disposed on the second main surface of the light emitting laminate and allowing a portion of the terminal unit to be exposed; and a wavelength conversion unit disposed on the first main surface of the light emitting laminate.

The molded unit may have a height less than a height of the terminal unit such that a portion of the terminal unit is protruded from the molded unit to be exposed.

The molded unit may include a filler and a white molding compound.

The filler may have one or more materials selected from the group consisting of $SiO_2$, $TiO_2$, and $Al_2O_3$.

The light emitting laminate may have a lamination structure in which an n-type semiconductor layer, an active layer, and a p-type semiconductor layer are laminated, the at least one electrode may be a plurality of electrodes connected to the n-type semiconductor layer and the p-type semiconductor layer, and the electrodes connected to the n-type semiconductor layer and the p-type semiconductor layer may be arranged in the same direction.

The terminal unit may include a solder bump.

The terminal unit may include a metal pillar disposed on the electrode, and at least one of a solder bump and a metal finish, disposed on the metal pillar.

The metal pillar may be embedded in the molded unit.

According to another aspect of the inventive concept, there is provided a light emitting element package including: a light emitting element having a first main surface, a second main surface opposing the first main surface, and a lateral surface connecting the first and second main surfaces; a reflective unit covering the lateral surface of the light emitting element and at least a portion of the first main surface; a wavelength conversion unit covering at least a portion of the second main surface of the light emitting element; first and second connection electrodes disposed on the first main surface of the light emitting element and electrically connected to the light emitting element; and first and second external electrodes disposed in positions farther from the light emitting element on the first main surface side of the light emitting element than the first and second connection electrodes, connected to the first and second connection electrodes, and disposed to be larger than the first and second connection electrodes to cover portions of the reflective unit.

The light emitting element may include a substrate, a light emitting structure disposed on the substrate and having a first conductivity-type semiconductor layer, an active layer, and a second conductivity-type semiconductor layer sequentially laminated therein, and a first connection electrode and a second connection electrode, disposed on the first conductivity-type semiconductor layer and the second conductivity-type semiconductor layer, respectively.

The light emitting element may include a substrate, a light emitting structure disposed on the substrate and having a first conductivity-type semiconductor layer, an active layer, and a second conductivity-type semiconductor layer sequentially laminated therein, a first conductivity-type contact layer electrically connected to the first conductivity-type semiconductor layer between the substrate and the first conductivity-type semiconductor layer, and having a first connection electrode extending in a direction of the substrate so as to be exposed outwardly, a second conductivity-type contact layer disposed between the substrate and the first conductivity-type contact layer and having a second connection electrode extending in the direction of the substrate so as to be exposed outwardly, a conductive via extending from the second conductivity-type contact layer and connected to the second conductivity-type semiconductor layer through the first conductivity-type contact layer, the first conductivity-type semiconductor layer, and the active layer, and an insulator electrically separating the second conductivity-type contact layer and the conductive via from the first conductivity-type contact layer, the first conductivity-type semiconductor layer, and the active layer.

The reflective unit may include a mixture of a highly reflective material and a curing resin.

The highly reflective material may be at least one of $TiO_2$ and $Al_2O_3$.

The first and second external electrodes may have a width equal to 20% to 50% of a lower area of the light emitting element package.

According to another aspect of the inventive concept, there is provided a light emitting device including: a light emitting element package including a light emitting element having a first main surface, and a second main surface opposing the first main surface, and a lateral surface connecting the first and second main surfaces, a reflective unit covering the lateral surface of the light emitting element and at least a portion of the first main surface, a wavelength conversion unit covering at least a portion of the second main surface of the light emitting element, first and second connection electrodes disposed on the first main surface of the light emitting element and electrically connected to the light emitting element, and first and second external electrodes disposed in positions farther from the light emitting element on the first main surface side of the light emitting element than the first and second connection electrodes, connected to the first and second connection electrodes, and extending in a lateral direction of the light emitting element to cover portions of the reflective unit; and a wiring pattern configured to apply an electrical signal for driving the light emitting element, wherein the light emitting element package is disposed on the wiring pattern such that the first and second external electrodes are electrically connected to the wiring pattern.

The foregoing technical solutions do not fully enumerate all of the features of the inventive concept. The foregoing and other objects, features, aspects and advantages of the inventive concept will become more apparent from the following detailed description of the inventive concept when taken in conjunction with the accompanying drawings.

BRIEF DESCRIPTION OF THE DRAWINGS

The above and other aspects, features and other advantages of the inventive concept will be more clearly understood from the following detailed description taken in conjunction with the accompanying drawings, in which:

FIGS. 4(a) through 4(g) are schematic views sequentially illustrating a method for manufacturing a light emitting element package according to an embodiment of the inventive concept;

FIGS. 5(a) through 5(i) are schematic views sequentially illustrating a method for manufacturing a light emitting element package according to another embodiment of the inventive concept;

DETAILED DESCRIPTION OF THE PREFERRED EMBODIMENT

Figure 1:
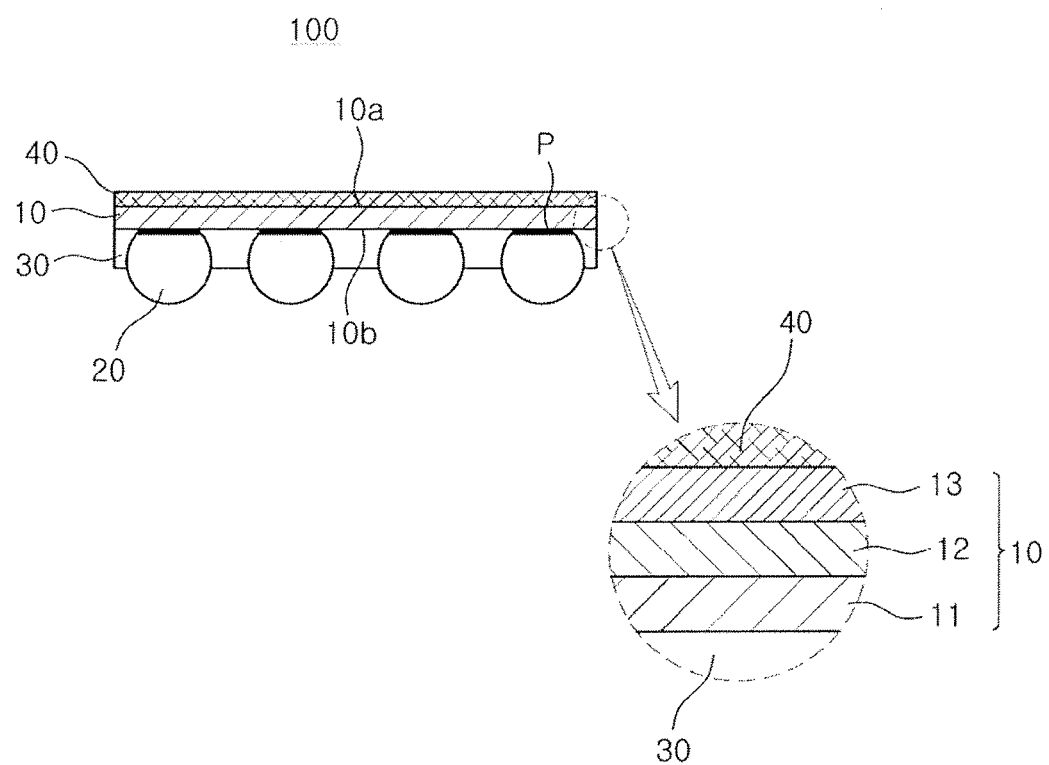
FIG. 1 is a cross-sectional view schematically illustrating a light emitting element package according to an embodiment of the inventive concept.

Embodiments of the inventive concept will now be described in detail with reference to the accompanying drawings.

The invention may, however, be embodied in many different forms and should not be construed as being limited to the embodiments set forth herein.

Rather, these embodiments are provided so that this disclosure will be thorough and complete, and will fully convey the scope of the invention to those skilled in the art.

In the drawings, the shapes and dimensions of elements may be exaggerated for clarity, and the same reference numerals will be used throughout to designate the same or like components.

Figure 2:
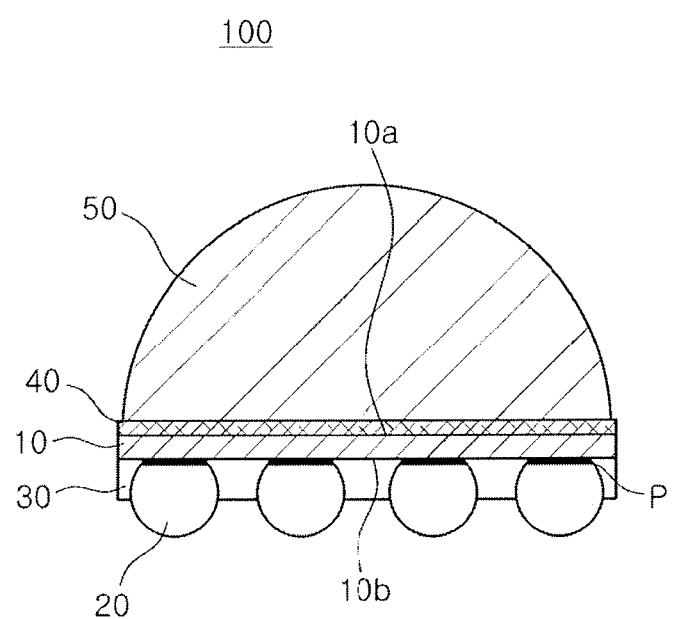
FIG. 2 is a cross-sectional view schematically illustrating a modification of FIG. 1.

A light emitting element package according to an embodiment of the inventive concept will be described with reference to FIGS. 1 and 2. FIG. 1 is a cross-sectional view schematically illustrating a light emitting element package according to an embodiment of the inventive concept, and FIG. 2 is a cross-sectional view schematically illustrating a modification of FIG. 1. A light emitting element package 100 according to the present embodiment may include a light emitting laminate 10, a terminal unit 20, a molded unit 30, and a wavelength conversion unit 40.

The light emitting laminate 10 may have a structure in which a plurality of semiconductor layers are laminated, and have a first main surface 10a and a second main surface 10b opposing one another. The light emitting laminate 10 may have an electrode P formed on the second main surface 10b corresponding to a lower surface, to form a light emitting diode (LED) chip. Here, the first main surface 10a and the second main surface 10b may refer to an upper surface and a lower surface of the light emitting laminate 10, based on the drawings. In that the first main surface 10a and the second main surface 10b are formed when viewed from above and below, the first main surface 10a as an upper surface and the second main surface 10b as a lower surface of the light emitting laminate 10 may be surfaces made of different materials or having different heights, respectively.

The light emitting laminate 10 may have a structure in which an n-type semiconductor layer 11, an active layer 12, and a p-type semiconductor layer 13 are laminated. Electrodes, i.e., an n-type electrode and a p-type electrode, may be formed on one surface of the n-type semiconductor layer 11 and the p-type semiconductor layer 13, respectively, and electrically connected to the respective semiconductor layers 11 and 13. The structure in which the n-type and the p-type semiconductor layers 11 and 13 and the n-type and p-type electrodes P are connected is known, so in the present embodiment, a drawing and a description of a specific connection structure thereof will be omitted. The electrodes P are formed in the same direction (in a downward direction in the drawing) on the respective semiconductor layers 11 and 13 of the second main surface 10b, so the light emitting laminate 10 itself corresponds to an LED chip having a horizontal structure. A plurality of electrodes P may be provided. In the present embodiment, four electrodes P (two n-type electrodes and two p-type electrodes) are illustrated, but the inventive concept is not limited thereto and the amount of the electrodes P may variously modified.

The terminal units 20 may be formed on the electrodes P, respectively, and may transfer power to the electrodes P upon receiving it from an external source of power. Also, in a case in which the light emitting element package according to an embodiment of the inventive concept is mounted on a board of an illumination device (not shown), or the like, the terminal units 20 may be provided as bonding areas for surface mounting.

The terminal units 20 may include solder bumps having a predetermined height. The solder bumps may be formed according to various methods such as electroplating, solder printing, or ball drop.

The molded unit 30 is formed on the second main surface 10b of the light emitting laminate 10 on which the terminal units 20 are formed, to support the terminal units 20. In detail, the molded unit 30 may be formed to fill the spaces between the terminal units 20 on the second main surface 10b of the light emitting laminate 10 on which the terminal units 20 are formed. Thus, since the terminal units 20 are enveloped by the molded unit 30, they can be more firmly fixed and supported and stably protected.

The molded unit 30 may be lower than the terminal units such that portions of the terminal units 20 are protruded from the molded unit 30 so as to be exposed outwardly. Thus, when the light emitting element package 100 according to the present embodiment is mounted on a board, it may be electrically connected to a circuit pattern formed on the board through the exposed terminal units 20.

The molded unit 30 may include a filler and a white molding compound having a high degree of light reflectivity. Thus, the molded unit 30 may reflect light emitted from the light emitting laminate 10, obtaining an effect of increasing a quantity of light emitted upwardly.

The filler may include one or more materials selected from the group consisting of $SiO_2$, $TiO_2$, and $Al_2O_3$. The white molding compound may include a thermosetting resin having a high degree of heat resistance or a silicone resin. Also, the white molding compound may include a thermoplastic resin including white pigment, a filler, a curing agent, a parting agent, an oxidation inhibitor, an adhesive strength improver, and the like. Besides the light reflecting properties, the molded unit 30 has a high glass transition temperature (Tg) equal to or higher than 100□, a low coefficient of thermal expansion (CTE) equal to or lower than 20 ppm, and a high degree of adhesive strength. Thus, since the terminal units 20 are encapsulated by the molded unit 30 having excellent mechanical properties, the terminal units 20 can be firmly supported and fixed, enhancing reliability.

The wavelength conversion unit 40 serves to convert a wavelength of light emitted from the light emitting laminate 10, and to this end, a structure in which at least one kind of a phosphor is dispersed in a transparent resin may be used. Light converted by the wavelength conversion unit 40 may be mixed with light emitted from the light emitting laminate 10 to implement white light. For example, when the light emitting laminate 10 emits blue light, a yellow phosphor may be used, and when the light emitting laminate 10 emits ultraviolet light, red, green, and blue phosphors may be mixedly used. Besides, the colors of the phosphors and the light emitting laminate 10 may be variably combined to emit white light. Also, only wavelength conversion materials such as green, red, and the like, may be applied to implement a light source for emitting relevant colors, not necessarily white light.

In detail, when blue light is emitted from the light emitting laminate 10, the red phosphor used therewith may include a MAlSiNx:Re ($1 \le x \le 5$) nitride phosphor, an MD:Re sulfide phosphor, and the like. Here, M is at least one selected from among Ba, Sr, Ca, and Mg, and D is at least one selected from among S, Se, and Te, while Re is at least one selected from among Eu, Y, La, Ce, Nd, Pm, Sm, Gd, Tb, Dy, Ho, Er, Tm, Yb, Lu, F, Cl, Br, and I. Also, the green phosphor used therewith may include an $M_2SiO_4$:Re silicate phosphor, an $MA_2D_4$:Re sulfide phosphor, a β-SiAlON:Re phosphor, and an $MA'_2O_4$:Re' oxide-based phosphor, and the like. Here, M may be at least one selected from among Ba, Sr, Ca, and Mg, A may be at least one selected from among Ga, Al, and In, D may be at least one selected from among S, Se, and Te, A' may be at least one selected from among Sc, Y, Gd, La, Lu, Al, and In, Re may be at least one selected from among Eu, Y, La, Ce, Nd, Pm, Sm, Gd, Tb, Dy, Ho, Er, Tm, Yb, Lu, F, Cl, Br, and I, and Re' may be at least one selected from among Ce, Nd, Pm, Sm, Tb, Dy, Ho, Er, Tm, Yb, F, Cl, Br, and I.

The wavelength conversion unit 40 may include quantum dots in the place of the phosphors or may be provided with the phosphors. A quantum dot is a nano-crystal particle including a core and a shell, and the core size thereof ranges from 2 nm to 100 nm. By adjusting the core size, the quantum dot may be used as phosphors emitting various colors such as blue (B), yellow (Y), green (G), and red (R), and at least two types of semiconductors among group II-VI compound semiconductors (ZnS, ZnSe, ZnTe, CdS, CdSe, CdTe, HgS, HgSe, HgTe, MgTe, etc.), group III-V compound semiconductors (GaN, GaP, GaAs, GaSb, InN, InP, InAs, InSb, AlAs, AlP, AlSb, AlS, etc.), or a group IV semiconductor (Ge, Si, Pb, etc.) may be hetero-joined to form a core and shell structure constituting a quantum dot. In this case, in order to terminate molecular binding on a surface of the shell of the quantum dot at an outer edge of the shell, in order to restrain cohesion of quantum dots to improve the dispersibility of a resin such as silicone resin, epoxy resin, or the like, or in order to improve the phosphor function, an organic ligand, using a material such as oleic acid, may be formed. The quantum dot is vulnerable to moisture or air, and in particular, when it is in contact with a circuit pattern (not shown) of a substrate or a lead frame (not shown) of a package, a chemical reaction may take place. Thus, as illustrated in the drawing, the wavelength conversion unit 40 may only be applied to the upper surface of the light emitting laminate 10, eliminating the possibility of contact with the circuit pattern or the lead frame, to thus enhance the reliability thereof. Thus, hereinafter, although the phosphors are taken as an example of the wavelength conversion material, the phosphors may be replaced with quantum dots, or quantum dots may be added to the phosphors.

In the present embodiment, the wavelength conversion unit 40 may be provided as a thin film on the upper surface of the light emitting laminate 10, i.e., on the first main surface 10*a* of the light emitting laminate 10. Thus, in comparison to the related art scheme in which phosphors, and the like, are injected within a cup of a package body having a premolded form, overall uniform light can be obtained. Also, the wavelength conversion unit 40 is directly applied to a surface of the light emitting laminate 10, and in that a package body having a premolded structure or a board on which the light emitting laminate 10 is mounted and electrically connected as in the related art is not separately provided, the package size can be reduced. Namely, an ultra-small package structure in which a chip size is equal to a package size can be implemented.

Meanwhile, as illustrated in FIG. 2, a lens 50 may be further formed on the wavelength conversion unit 40. The lens 50 may be formed as a convex lens convexly protruded from the wavelength conversion unit 40 to allow light emitted through the wavelength conversion unit 40 to be irradiated to a broader region. In the present embodiment, it is illustrated that the lens 50 is formed as a convex lens, but the shape of the lens 50 is not limited thereto.

Figure 3A:
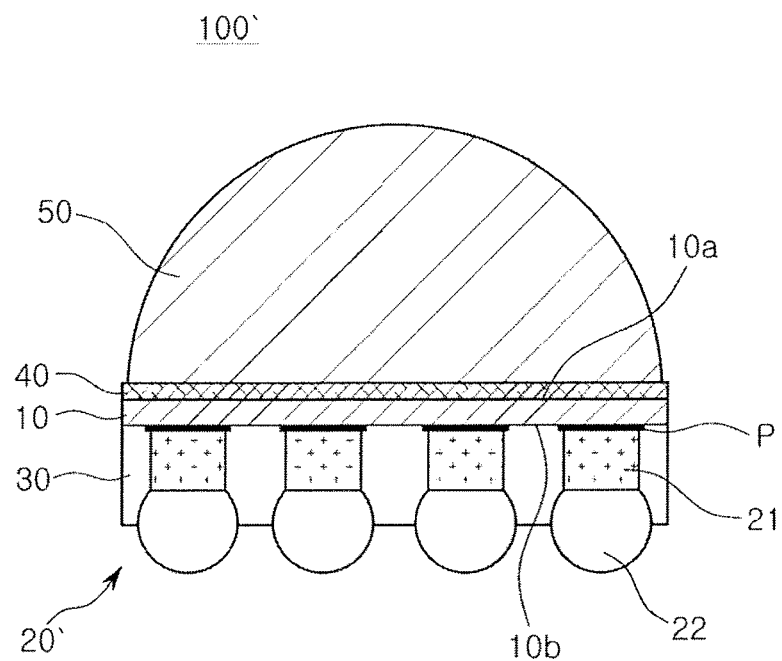
FIGS. 3(a) and 3(b) are cross-sectional views schematically illustrating a light emitting element package according to another embodiment of the inventive concept.
Figure 3B:
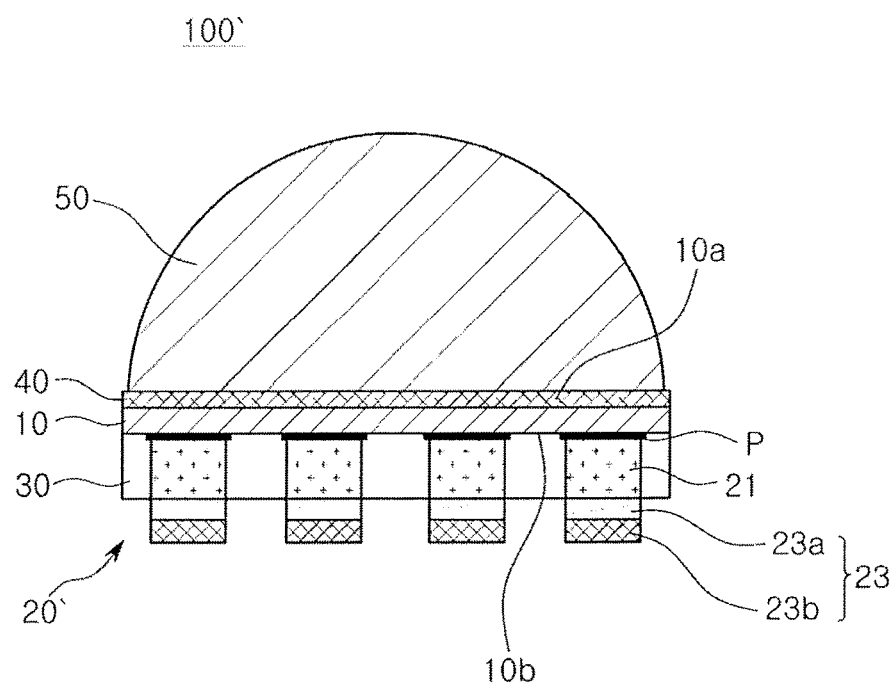

A light emitting element package according to another embodiment of the inventive concept will be described with reference to FIGS. 3(*a*) and 3(*b*). FIGS. 3(*a*) and 3(*b*) are cross-sectional views schematically illustrating a light emitting element package according to another embodiment of the inventive concept.

A basic structure of a light emitting element package according to an embodiment of the inventive concept illustrated in FIGS. 3(*a*) and 3(*b*) is substantially the same as that of the embodiment illustrated in FIGS. 1 and 2, except for a structure of a terminal unit. Thus, descriptions of elements the same as those of the former embodiment will be omitted and a configuration of the terminal unit will be largely described.

As illustrated in FIG. 3(*a*), a terminal unit 20' may include a metal pillar 21 formed on the electrode P and a Solder bump 22 formed on the metal pillar 21. The metal pillar 21 may be formed on the electrode P of the light emitting laminate 10 and electrically connected thereto and embedded in the molded unit 30. The solder bump 22 may be formed on the metal pillar 21 and protruded from the molded unit 30 so as to be exposed outwardly. In this manner, when the metal pillar 21 is applied, a space between the solder bumps 22 can be reduced, relative to a case in which only the solder bumps are provided. Thus, since more solder bumps 22 may be formed, heat dissipation efficiency of the light emitting element package 100' can be enhanced.

Meanwhile, as illustrated in FIG. 3(*b*), the terminal unit 20' may include a metal pillar 21 formed on the electrode P and a metal finish 23 formed on the metal pillar 21. The metal pillar 21 may be formed on the light emitting laminate 10 and electrically connected thereto. The metal pillar 21 may be embedded in the molded unit 30. The metal finish 23 may be formed on the metal pillar 21 and protruded from the molded unit 30 so as to be exposed outwardly. The metal finish 23 may be formed by sequentially laminating a gold (Au) layer 23*a* and a nickel (Ni) layer 23*b* on the metal pillar 21 through a plating method. In the case of employing the metal finish 23 instead of the solder bump 22, a possibility in which the solder bump 22 is melted down due high temperature generated by the light emitting element package 100' can be prevented.

Figure 4A:
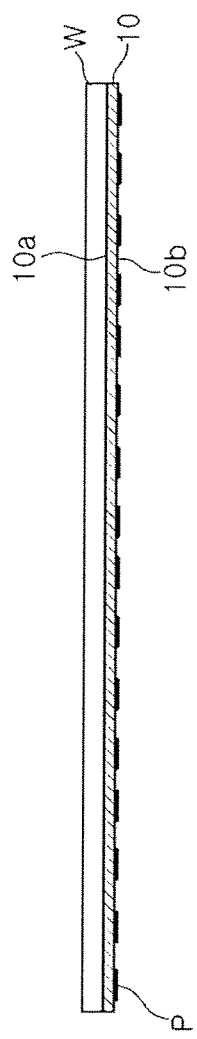
Figure 4B:
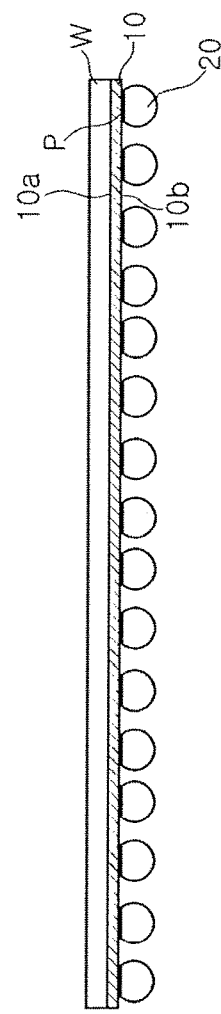
Figure 4C:
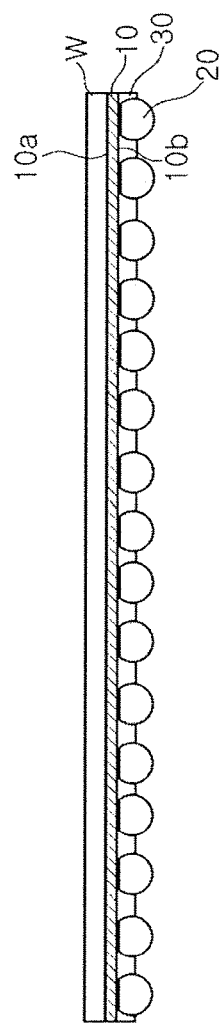

A method for manufacturing a light emitting element package according to an embodiment of the inventive concept will be described with reference to FIGS. 4(*a*) through 4(*g*). FIGS. 4(*a*) through 4(*g*) are schematic views sequentially illustrating a method for manufacturing a light emitting element package according to an embodiment of the inventive concept, and a light emitting element package manufactured through the method has the same structure as that illustrated in FIG. 2.

First, as illustrated in FIG. 4(*a*), a wafer W with the light emitting laminate 10, which has a lamination structure of semiconductor layers and has a first main surface 10*a* and a second main surface 10*b*, formed on one surface thereof is provided. Here, the wafer W may be provided as a growth substrate for growing a semiconductor layer on an upper surface thereof through a chemical vapor deposition (CVD) device (not shown). The semiconductor layers constituting the light emitting laminate 10 may include the n-type semiconductor layer 11, the active layer 12, and the p-type semiconductor layer 13 sequentially grown and laminated on the wafer W.

Electrodes P, i.e., n-type and p-type electrodes, may be formed on one surface of the n-type semiconductor layer 11 and the p-type semiconductor layer 13, respectively, and electrically connected to the respective semiconductor layers 11 and 13. The electrodes P may be formed in the same direction on the respective semiconductor layers 11 and 13 of the second main surface 10*b*, forming the light emitting laminate 10 having a horizontal structure. In this case, a plurality of electrodes P may be provided.

Next, as illustrated in FIG. 4(*b*), the terminal units 20 are formed on the electrodes P provided on the light emitting laminate 10. The terminal units 20 may include solder bumps having a predetermined height, and bump balls may be formed through a reflow process after performing solder printing. The terminal units 20 may also be formed through various other methods such as electroplating, ball drop, and the like.

Thereafter, as illustrated in FIG. 4(*c*), the molded unit is formed on the second main surface 10*b* of the light emitting laminate 10 such that the terminal units 20 are supported. The molded unit 30 may be formed by molding a white molding compound having a high degree of light reflectivity and containing a filter on the surface of the light emitting laminate 10 on which the terminal units 20 are formed, such that spaces between the terminal units 20 are filled. Here, the molded unit 30 may be lower than the terminal units 20 such that portions of the terminal units 20 are protruded from the molded unit 20 so as to be exposed.

The filler may include one or more materials selected from the group consisting of $SiO_2$, $TiO_2$, and $Al_2O_3$. The white molding compound may include a thermosetting resin having a high degree of heat resistance or a silicone resin. Also, the white molding compound may include a thermoplastic resin including white pigment, a filler, a curing agent, a parting agent, an oxidation inhibitor, an adhesive strength improver, and the like.

Thereafter, as illustrated in FIG. 4(*d*), the wafer W is separated from the light emitting laminate 10. In this case, the wafer W may be separated from the light emitting laminate 10 through a laser lift-off (LLO) process, an etching process, a polishing process, or the like.

Thereafter, as illustrated in FIG. 4(*e*), the wavelength conversion unit 40 is formed on the first main surface 10*a* of the light emitting laminate 10 exposed as the wafer W was separated. The wavelength conversion unit 40 may be formed by printing or coating a transparent resin such as silicone, an epoxy, or the like, to have a predetermined thickness. Alternatively, the wavelength conversion unit 40 may also be formed by attaching a transparent resin as a thin film.

The resin material used to form the wavelength conversion unit 40 may include at least one type of phosphor able to convert a wavelength of light emitted from the light emitting laminate 10. Light converted by the wavelength conversion unit 40 may be mixed with light emitted from the light emitting laminate 10 to implement white light. Also, the light may not necessarily be white, and only a wavelength conversion material such as green, red, or the like, may be coated to implement a light source emitting light having a corresponding color.

Thereafter as illustrated in FIG. 4(f), the lens 50 is formed on the wavelength conversion unit 40. The lens 50 may have a dome-like shape upwardly convex to enhance an angle of beam spread of emitted light. Besides, the lens 50 may be formed to have various other shapes. The lens 50 may be directly formed on the wavelength conversion unit 40 through a molding method such as compression molding, transfer molding, or the like, or porting method using a dispenser, or may be fabricated through a separate process and attached to the wavelength conversion unit 40 through an adhesive, or the like.

Thereafter, as illustrated in FIG. 4(g), the light emitting laminate 10 with the terminal units 20 and the molded units 30 formed on one surface thereof and the wavelength conversion unit 40 and the lenses 40 formed on the other surface thereof is cut along cutting lines to separate it into individual light emitting element packages 100. In the present embodiment, the lenses 50 are formed on the wavelength conversion units 40, respectively, and the individual packages are separated, but the inventive concept is not limited thereto and, after the individual packages are separated, the lenses 50 may be individually formed on the light emitting units 40 of the respective light emitting element packages. Also, the light emitting element package 100 without the lenses 50 as illustrated in FIG. 1 may also be used.

A method for manufacturing a light emitting element package according to another embodiment of the inventive concept will be described with reference to FIG. 5. FIGS. 5(a) through 5(i) are schematic views sequentially illustrating a method for manufacturing a light emitting element package according to another embodiment of the inventive concept. A light emitting element package manufacturing through this method has the same structure as that illustrated in FIG. 3(b).

First, as illustrated in FIG. 5(a), a wafer W with the light emitting laminate 10, which has a lamination structure of semiconductor layers and has a first main surface 10a and a second main surface 10b, formed on one surface thereof is provided. Here, the wafer W may be provided as a growth substrate for growing a semiconductor layer on an upper surface thereof through a chemical vapor deposition (CVD) device (not shown). The semiconductor layers constituting the light emitting laminate 10 may include the n-type semiconductor layer 11, the active layer 12, and the p-type semiconductor layer 13 sequentially grown and laminated on the wafer W.

Electrodes P, i.e., n-type and p-type electrodes, may be formed on one surface of the n-type semiconductor layer 11 and the p-type semiconductor layer 13, respectively, and electrically connected to the respective semiconductor layers 11 and 13. The electrodes P may be formed in the same direction on the respective semiconductor layers 11 and 13 of the second main surface 10b, forming the light emitting laminate 10 having a horizontal structure. In this case, a plurality of electrodes P may be provided.

Next, as illustrated in FIG. 5(b), the terminal units 20' are formed on the electrodes P provided on the light emitting laminate 10. The terminal units 20' may include metal pillars 21 having a predetermined height, and the metal pillars 21 may be formed through a plating method such as electroplating, electroless plating.

Thereafter, as illustrated in FIG. 5(c), the molded unit is formed on the second main surface 10b of the light emitting laminate 10 such that the terminal units 20' are supported. The molded unit 30 may be formed by molding a white molding compound having a high degree of light reflectivity and containing a filter on the surface of the light emitting laminate 10 on which the terminal units 20 are formed, such that spaces between the terminal units 20 are filled. Here, the molded unit 30 may be lower than the terminal units 20 such the terminal units 20' are entirely covered.

Thereafter, as illustrated in FIG. 5(d), after molding is performed to cover the terminal units 20', portions of the molded unit 30 are removed such that portions of the terminal units 20', i.e., the metal pillars 21', are exposed from the molded unit 30. In this case, the molded unit 30 may be removed through a process such as etching, exposure, polishing, or the like. In the present embodiment, portions of the molded unit 30 are removed such that the molded unit 30 is parallel to exposed ends of the terminal units 20' overall. However, the inventive concept is not limited thereto and portions of the molded unit 30 may be removed to correspond to the positions of the terminal units 20' such that only ends of the terminal units 20' are exposed.

Thereafter, as illustrated in FIG. 5(e), metal finishes are formed on the exposed ends of the metal pillars 21, completing the terminal units 20'. Here, the metal finishes 23 may be formed through a plating method such as electroplating or electroless plating, and may have a structure in which a gold (Au) layer 23a and a nickel (Ni) layer 23b are sequentially laminated on the metal pillar 21, respectively. The metal finishes 23 may be protruded from the molded units 30.

Thereafter, as illustrated in FIG. 5(f), the wafer W is separated from the light emitting laminate 10. In this case, the wafer W may be separated from the light emitting laminate 10 through a laser lift-off (LLO) process, an etching process, a polishing process, or the like. In the present embodiment, it is illustrated and described that the wafer W is separated after the metal finishes 23 are formed, but the order may be changed. Namely, after the wafer W is separated, the metal finishes 23 may be formed.

Thereafter, as illustrated in FIG. 5(g), the wavelength conversion unit 40 is formed on the first main surface 10a of the light emitting laminate 10 exposed as the wafer W was separated. The wavelength conversion unit 40 may be formed by printing or coating a transparent resin such as silicone, an epoxy, or the like, to have a predetermined thickness. Alternatively, the wavelength conversion unit 40 may also be formed by attaching a transparent resin as a thin film.

The resin material used to form the wavelength conversion unit 40 may include at least one type of phosphor able to convert a wavelength of light emitted from the light emitting laminate 10. Light converted by the wavelength conversion unit 40 may be mixed with light emitted from the light emitting laminate 10 to implement white light. Also, the light may not necessarily be white, and a wavelength conversion material such as green, red, or the like, may be coated to implement a light source emitting light having a corresponding color.

Figure 5H:
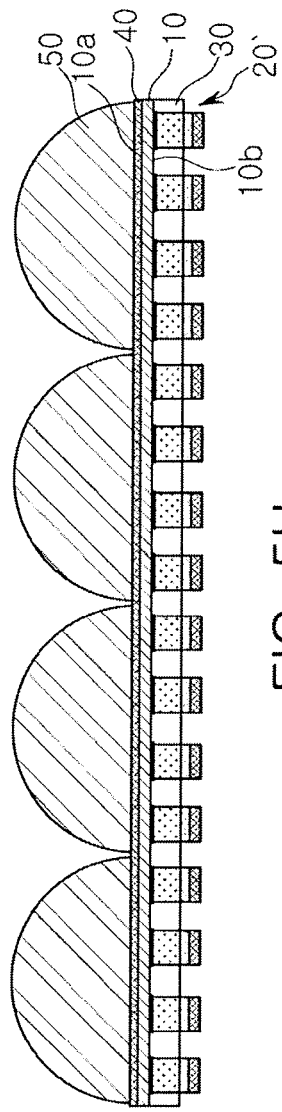

Thereafter as illustrated in FIG. 5(h), the lens 50 is formed on the wavelength conversion unit 40. The lens 50 may have a dome-like shape upwardly convex to enhance an angle of beam spread of emitted light. Besides, the lens 50 may be formed to have various other shapes. The lens 50 may be directly formed on the wavelength conversion unit 40 through a molding method such as compression molding, transfer molding, or the like, or porting method using a dispenser, or may be fabricated through a separate process and attached to the wavelength conversion unit 40 through an adhesive, or the like.

Figure 5I:
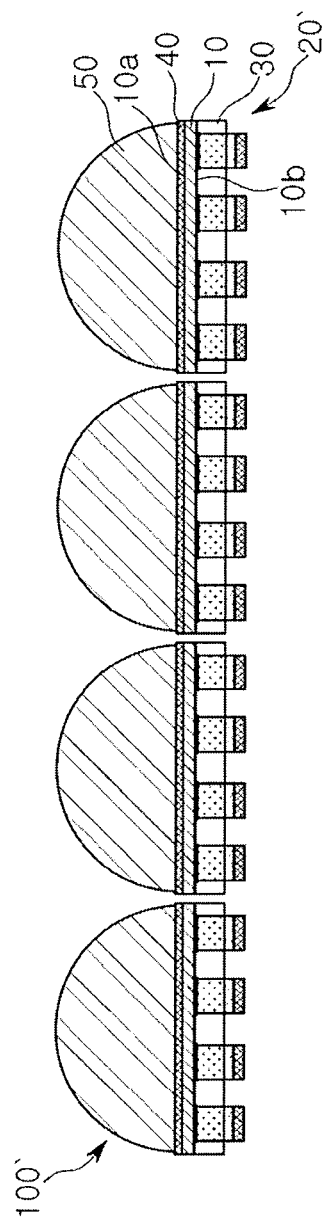

Thereafter, as illustrated in FIG. 5(i), the light emitting laminate 10 with the terminal units 20' and the molded units 30 formed on one surface thereof and the wavelength conversion unit 40 and the lenses 40 formed on the other surface thereof are cut along cutting lines to be separated into individual light emitting element packages 100'. In the present embodiment, the lenses 50 are formed on the wavelength conversion units 40, respectively, and the individual packages are separated, but the inventive concept is not limited thereto and, after the individual packages are separated, the lenses 50 may be individually formed on the light emitting units 40 of the respective light emitting element packages. Also, the light emitting element package 100' without the lenses 50 as illustrated in FIG. 1 may also be used.

As discussed above, in the case of the light emitting element package according to the present embodiment, since the manufacturing process is performed on a wafer level by using the light emitting laminate constituting an LED chip grown on one surface of a wafer as a growth substrate, processes of fabricating a pre-mold or a substrate, and mounting and packaging individually manufactured LED chips such as those of the related art are omitted, simplifying the overall manufacturing process. In particular, light emitting element packages having the same light characteristics can be collectively mass-produced, and as an area of a wafer is increased, productivity can be increased, lowering manufacturing costs.

Also, since the LED chip fabricated on a wafer level directly forms a light emitting package, an ultra-small light emitting element package having a chip size can be implemented.

Figure 6:
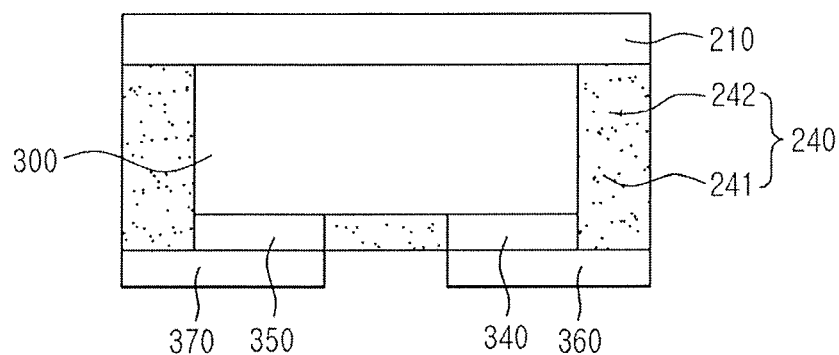
FIG. 6 is a cross-sectional view illustrating a light emitting element package according to an embodiment of the inventive concept.
Figure 7:
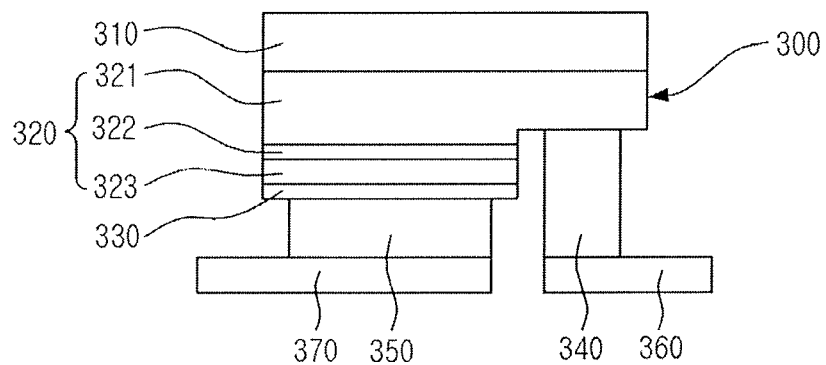
FIG. 7 is a cross-sectional view schematically illustrating an example of a light emitting element of the light emitting element package of FIG. 6.
Figure 8:
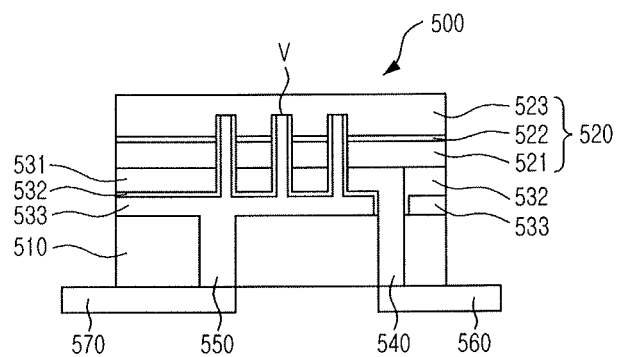
FIG. 8 a cross-sectional view schematically illustrating another example of a light emitting element of the light emitting element package of FIG. 6.

FIG. 6 is a cross-sectional view illustrating a light emitting element package according to an embodiment of the inventive concept. FIG. 7 is a cross-sectional view schematically illustrating an example of a light emitting element of the light emitting element package of FIG. 6. FIG. 8 is a cross-sectional view schematically illustrating another example of a light emitting element of the light emitting element package of FIG. 6.

Referring to FIG. 6, a light emitting element package 200 according to an embodiment of the inventive concept may include a light emitting element 300 including a first connection electrode 340 and a second connection electrode 350, a first external electrode 360 and a second external electrode 370 connected to the first connection electrode 340 and the second connection electrode 350 and also electrically connected to a wiring pattern applying power to the light emitting element 300, a wavelength conversion unit 210 as a light conversion layer formed on an upper portion of the light emitting element 200 and converting a wavelength of light generated by the light emitting element 300, and a reflective unit 240 surrounding the light emitting element 300.

Referring to dispositional relationships between the respective components, when it is assumed that the light emitting element 300 has first and second main surfaces opposing one another, the first connection electrode 340 and the second connection electrode 350 are formed on the first main surface (i.e., a lower surface based on FIG. 6), the first external electrode 360 and the second external electrode 370 are connected to the first connection electrode 340 and the second connection electrode 350, respectively, the wavelength conversion unit 210 is formed on the second main surface (i.e., an upper surface based on FIG. 6), and the reflective unit 240 is formed to cover lateral surfaces of the light emitting element 300 and at least a portion of the first main surface.

The light emitting element 300, a type of semiconductor device outputting light having a predetermined wavelength by an electrical signal applied from an external source of power, may include an LED. The light emitting element 300 may output blue light, red light, or green light according to a material contained therein, and may output white light.

The light emitting element 300 may have a structure including a plurality of layers made of predetermined semiconductor compounds. The first electronic electrode 340, the second connection electrode 350, the first external electrode 360, and the second external electrode 370, which are to be electrically connected to a wiring pattern applying an electrical signal for driving the light emitting element, are formed on the lower surface, i.e., the first main surface, of the light emitting element 300. The electrodes 340, 350, 360, and 370 may be, for example, a plurality of P-type electrodes and N-type electrodes.

Meanwhile, the wavelength conversion unit 210 may be provided on the upper surface, i.e., the second main surface, of the light emitting element 300. The wavelength conversion unit 210, serving to convert a wavelength of light emitted from the light emitting element 300 into a different wavelength, may be formed as a thin film on at least a portion of a light emitting surface, i.e., on the second main surface of the light emitting element 300 in the present embodiment. Since the wavelength conversion unit 210 is provided as a thin film, it may have a relatively uniform shape and thickness, minimizing chromaticity deviation of light with respect to a light emission direction, and in addition, reducing chromaticity distribution between or among different devices.

Meanwhile, in order to perform a light conversion function, the wavelength conversion unit 210 may have a wavelength conversion material such as a phosphor or a quantum dot. In this case, the wavelength conversion material may have a plate structure made by itself (e.g., a ceramic converter) or may have a film structure dispersed in a silicone resin, or the like. A quantum dot is a nano-crystal particle including a core and a shell, and a core size thereof ranges from 2 nm to 100 nm. By adjusting the core size, quantum dots may be used as phosphor materials emitting light of various colors such as blue (B), yellow (Y), green (G), and red (R), and at least two types of semiconductors among group II-VI compound semiconductors (ZnS, ZnSe, ZnTe, CdS, CdSe, CdTe, HgS, HgSe, HgTe, MgTe, etc.), group III-V compound semiconductors (GaN, GaP, GaAs, GaSb, InN, InP, InAs, InSb, AlAs, AlP, AlSb, AlS, etc.), and group IV semiconductors (Ge, Si, Pb, etc.) may be hetero-joined to form a core and shell structure constituting a quantum dot. In this case, in order to terminate molecular binding on a surface of the shell of the quantum dot at an outer edge of the shell, in order to restrain cohesion of quantum dots to improve dispersibility in a resin such as a silicone resin, an epoxy resin, or the like, or in order to improve a phosphor function, an organic ligand, using a material such as oleic acid, may be formed. Also, the wavelength conversion unit 210 may contain an ultraviolet ray absorbent absorbing ultraviolet rays generated by the light emitting element 300.

Meanwhile, a protective film may be further formed on an upper surface of the wavelength conversion unit 210 in order to protect the light emitting element from an external environment. Also, in order to adjust an angle of beam spread, a lens unit may be additionally provided on an upper surface of the wavelength conversion unit 210. The lens unit may be formed by injection-molding a lens forming material such as transparent silicone, an epoxy resin, plastic, or the like, on the wavelength conversion unit 210 of the light emitting element package 200. As the lens unit, a lens having a flat upper surface as a light output surface may be used, or a lens having a convex portion available for local lighting in a desired direction by narrowing an angle of beam spread of light emitted from the light emitting element 300.

As illustrated in FIG. 6, the reflective unit 240 may be formed to cover lateral surfaces of the light emitting element 300 and at least a portion of the first main surface of the light emitting element 300, and serve to guide light emitted from the light emitting element 300 upwardly. Here, since the reflective unit 240 may cover the first main surface on which the first and second connection electrodes 340 and 350 of the light emitting element 300 are formed and also cover the lateral surfaces of the first and second connection electrodes 340 and 350, light may be further concentrated in the upward direction.

In order to perform such a light reflection function, the reflective unit 240 may be made of any material capable of performing a light reflection function, and in that the reflective unit 240 is in contact with the light emitting element 300 and the first and second connection electrodes 340 and 350, the reflective unit 240 may be made of a material having electrical insulating properties.

The reflective unit 240 may be made of a mixture of a highly reflective material 241 reflecting light generated within the light emitting element 300, i.e., light generated by an active layer 322 and a curing resin 242.

Here, the highly reflective material 241 may be provided in the form of powder particles, and in this case, the powder particles may have a particle diameter ranging from 10 nm to 10 μm, and in order to be more evenly distributed in the curing resin, preferably, the powder particles should have a particle diameter equal to or less than 1 μm (on the submicron level). Also, the highly reflective material 241 reflects light generated within the light emitting element 300, i.e., light generated by the active layer 322, allowing the light to be emitted outwardly, without light absorption, so, preferably, the highly reflective material 241 may have a diffuse reflectance equal to or higher than 70% with respect to light. The highly reflective material 241 may be $TiO_2$ or $Al_2O_3$.

The curing resin 242 constituting the reflective unit 240 may be a polymer material such as, for example, silicone, epoxy, polyimide, or the like. Also, the curing resin 242 may have reflectivity, for example, equal to or less than about 1.5 in order to enhance reflection performance.

In this manner, in the light emitting element package, since light generated by the active layer 322 of the light emitting element 300 is reflected by the highly reflective material 241 included in the reflective unit 240 so as to be released outwardly, rather than being lost in the reflective unit 240, enhanced luminous efficiency can be obtained.

Any device may be used as the light emitting element 300 of the light emitting element package 200, as long as it can emit light, and, for example, an LED may be used.

FIG. 7 is a cross-sectional view schematically illustrating an example of a light emitting element of the light emitting element package of FIG. 6.

Referring to FIG. 7, the light emitting element 300 may include a light emitting structure 320 in which a first conductivity-type semiconductor layer 321, an active layer 322, a second conductivity-type semiconductor layer 323 are sequentially laminated. The light emitting structure 320 may be configured such that the active layer 322 and the second conductivity-type semiconductor layer 323 are mesa-etched to allow a partial region of the first conductivity-type semiconductor layer 321 to be exposed. Here, a growth substrate 310 refers to a general wafer for fabricating a light emitting element, and it may be a transparent substrate made of $Al_2O_3$, ZnO, $LiAl_2O_3$, or the like. In the present embodiment, the growth substrate 310 may be a sapphire substrate. According to circumstances, the growth substrate 310 may be excluded.

The first connection electrode 340 and the second connection terminal 350 are formed on the exposed first conductivity-type semiconductor layer 321 and the second conductivity-type semiconductor layer 323 of the light emitting structure 320, respectively. Also, the first external electrode 360 and the second external electrode 370 are connected to the first connection electrode 340 and the second connection electrode 350 and extend in a lateral direction of the light emitting element 300, respectively. Thus, the first external electrode 360 and the second external electrode 370 may be formed up to a lower surface of the reflective unit 240 to cover portions of the reflective unit 240 to be formed later.

Here, preferably, the first external electrode 360 and the second external electrode 370 may be larger than the first connection electrode 340 and the second connection electrode 350. Namely, the first external electrode 360 and the second external electrode 370 may have a width equivalent to 20% to 50% of a lower area of the light emitting element package.

The first connection electrode 340 and the second connection electrode 350 may be bonded to the first external electrode 360 and the second external electrode 370 through plating, by using a conductive adhesive, or by a high temperature treatment.

Since the first external electrode 360 and the second external electrode 370 connected to the first connection electrode 340 and the second connection electrode 350 are formed up to a lower surface of the reflective unit 240 to cover portions of the reflective unit 240 to be formed later, a size of the electrodes can be increased without increasing a size of the light emitting element package, and thus, the light emitting element package may be directly mounted on a wiring pattern.

Here, in the light emitting element 300, before the formation of the first conductivity-type semiconductor layer 321 on the growth substrate 310, a low-temperature nucleation layer including AlN or GaN may be formed as a buffer layer in order to alleviate lattice mismatch with the sapphire substrate.

Also, in order to reflect light, which is emitted toward the second connection electrode 350, to a light emitting surface, a reflective metal layer 330 may be formed on the second conductivity-type semiconductor layer 323. The reflective metal layer 330 may be made of a material having a high degree of reflectivity in consideration of a structural aspect of the light emitting package having a flip-chip structure, while lowering contact resistance with the second conductivity-type semiconductor layer 323 having a relatively high energy band gap. Namely, the reflective metal layer 330 may be made of a material selected from the group consisting of silver (Ag), nickel (Ni), aluminum (Al), phenyl (Ph), palladium (Pd), iridium (Ir), ruthenium (Ru), magnesium (Mg), zinc (Zn), platinum (Pt), gold (Au), and any combination thereof. Preferably, the reflective metal layer 330 may have a degree of reflectively equal to or higher than 70%. However, the reflective metal layer 330 may be omitted.

The first connection electrode 340 and the second connection electrode 350 may be connected to the first external electrode 360 and the second external electrode 370, and the first external electrode 360 and the second external electrode 370 may be directly connected to a wiring pattern.

FIG. 8 a cross-sectional view schematically illustrating another example of a light emitting element of the light emitting element package of FIG. 6.

Referring to FIG. 8, in a semiconductor light emitting element 500, a first conductivity-type contact layer 531 is formed on a substrate 510, a light emitting structure 520, i.e., a structure including a first conductivity-type semiconductor layer 521, an active layer 522, and a second conductivity-type semiconductor layer 523, is formed on the first conductivity-type contact layer 531. A second conductivity-type contact layer 533 is formed between the first conductivity-type contact layer 531 and the substrate 510, and electrically connected to the second conductivity-type semiconductor layer 523 through a conductive via V. The first and second conductivity-type contact layers 531 and 533 may be electrically separated, and to this end, an insulator 532 may be interposed between the first conductivity-type contact layer 531 and the second conductivity-type contact layer 533.

In the present embodiment, the first conductivity-type contact layer 531 may have a first connection electrode 540 extending in a direction of the substrate 510 so as to be exposed outwardly, and similarly, the second conductivity-type contact layer 533 may have a second connection electrode 550 extending in a direction of the substrate 510 so as to be exposed outwardly. In order to obtain this structure, the first conductivity-type contact layer 531 may be formed in a through hole formed in the second conductivity-type contact layer 533, and the insulator 532 may be formed in the through hole in order to electrically separate the first and second conductivity-type contact layers 531 and 533. Also, as illustrated in FIG. 8, the first and second conductivity-type contact layers 531 and 533 may be formed in a through hole formed in the substrate 510.

The first external electrode 560 and the second external electrode 570 may be connected to the first connection electrode 540 and the second connection electrode 550, respectively, and may extend in a direction of the lateral surfaces of the light emitting element. Thus, the first external electrode 560 and the second external electrode 570 connected to the first connection electrode 540 and the second connection electrode 550 may be formed to cover portions of the reflective unit 240 to be formed thereafter.

Here, preferably, the first external electrode 560 and the second external electrode 570 are larger than the first connection electrode 540 and the second connection electrode 550. Namely, the first external electrode 560 and the second external electrode 570 may have a width of 20% to 50% of the lower area of the light emitting element package.

The first connection electrode 540 and the second connection electrode 550 may be bonded to the first external electrode 560 and the second external electrode 570 through plating, by using a conductive adhesive, or through a high temperature treatment.

Since the first external electrode 560 and the second external electrode 570 connected to the first connection electrode 540 and the second connection electrode 550 are formed up to a lower surface of the reflective unit 240 to cover portions of the reflective unit 240 to be formed later, a size of the electrodes can be increased without increasing a size of the light emitting element package, and thus, the light emitting element package may be directly mounted on a wiring pattern.

Here, since the first connection electrode 540 and the second connection electrode 550 are exposed to lower portions of the device, an electrically insulating substrate may be used as the substrate 510. For example, an appropriate substrate may be selected from among substrates made of materials such as a ceramic, sapphire, and the like, by using characteristics such as heat conductivity, a coefficient of thermal expansion, and the like. The substrate 510 may also be made of a conductive material, besides an electrically insulating substrate. For example, a substrate made of a material including any one of gold (Au), nickel (Ni), copper (Cu), tungsten (W), silicon (Si), selenium (Se), gallium arsenide (GaAs). Although not shown in FIG. 8, in the case in which the substrate 510 is made of a conductive material, the insulator 532 may be required to be formed between the substrate 510 and the first conductivity-type contact layer 533.

Besides, various types of light emitting elements in which electrodes are formed in a lower portion may be applied to the inventive concept.

In the light emitting element package according to an embodiment of the inventive concept, since the electrode unit, the reflective unit, and the wavelength conversion unit are directly formed in the light emitting element, a production process may be simplified, and thus, the unit cost of production can be lowered. Also, since the size of the light emitting element package is minimized, the light emitting element package may be advantageous as a point light source.

In the light emitting element package according to an embodiment of the inventive concept, since the size of the electrode formed in the light emitting element can be increased, a wiring pattern can be immediately connected to the electrode formed in the light emitting element. Thus, since the light emitting element package can be directly mounted on the wiring pattern to form a light emitting device, excellent heat dissipation efficiency can be obtained.

FIGS. 9 through 17 are cross-sectional views sequentially illustrating a method for manufacturing a light emitting element package according to an embodiment of the inventive concept. Here, a plurality of light emitting element packages may be manufactured through the method for manufacturing a light emitting element package by using a predetermined wave, but for the purposes of description, a method for fabricating some light emitting elements is illustrated, and since the light emitting element packages have the same structure, reference numerals will be used for only one light emitting element package and described.

Figure 9:
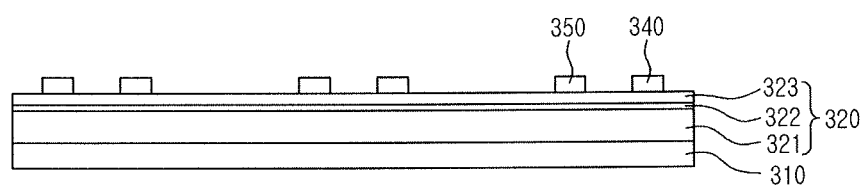
FIGS. 9 through 17 are cross-sectional views sequentially illustrating a method for manufacturing a light emitting element package according to an embodiment of the inventive concept.

In the case of a manufacturing method according to the present embodiment, first, as illustrated in FIG. 9, the first conductivity-type semiconductor layer 321, the active layer 322, and the second conductivity-type semiconductor layer 323 are sequentially laminated on the growth substrate 310 to form the light emitting structure 320, and the first connection electrode 340 and the second connection electrode 350 are formed. Here, the growth substrate 310 may be omitted.

The light emitting structure 320 may be made of a semiconductive material having an empirical formula AlxInyGa (1-x-y)N (here, 0≤x≤1, 0≤y≤1, 0≤x+y≤1), and may be formed through various deposition and growth methods including chemical vapor deposition (CVD), metal-organic chemical vapor deposition (MOCVD), plasma-enhanced chemical vapor deposition (PCVD), molecular beam epitaxy (MBE), hydride vapor phase epitaxy (HVPE), or the like.

Figure 10:
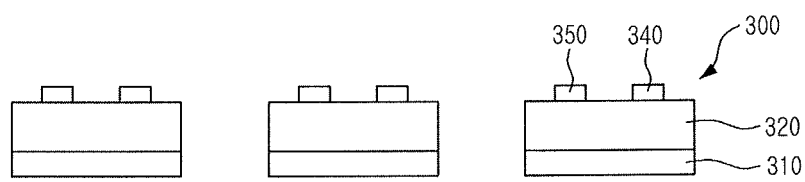

A dicing process is performed on the structure formed thusly. As illustrated in FIG. 10, the structure is separated into respective light emitting elements 300.

Without being limited to the foregoing method, the process of fabricating a light emitting element may be variously modified and further include various films. For example, the reflective metal layer of the second conductivity-type semiconductor layer may be formed as a plurality of layers.

Figure 11:
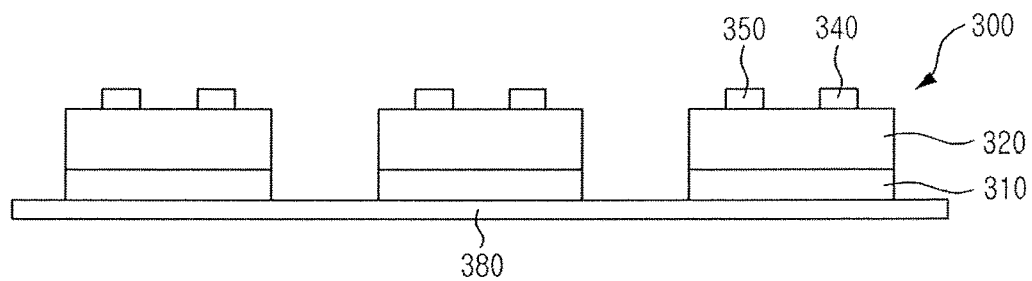

Subsequently, as illustrated in FIG. 11, the separated light emitting element 300 is attached to a base film 380.

The light emitting element 300 includes first and second connection electrodes 340 and 350 for receiving an external electrical signal, and includes a bare chip without a wavelength conversion unit on a surface thereof.

Here, the light emitting element 300 is attached such that a second main surface of the light emitting element 300 opposing the first main surface on which the first connection electrode 340 and the second connection electrode 350 are formed faces the base film 380.

The first and second connection electrodes 340 and 350 may be, for example, a P-type electrode and an N-type electrode, respectively. Also, the first external electrode 360 and the second external electrode 370 may be further provided on the first and the connection electrodes 340 and 350 in a follow-up process.

Here, the light emitting elements 300 may be disposed to be spaced apart from one another at predetermined intervals, and a plurality of light emitting elements are arranged in a column direction and a row direction on the base film 380 to form a matrix structure.

Figure 12:
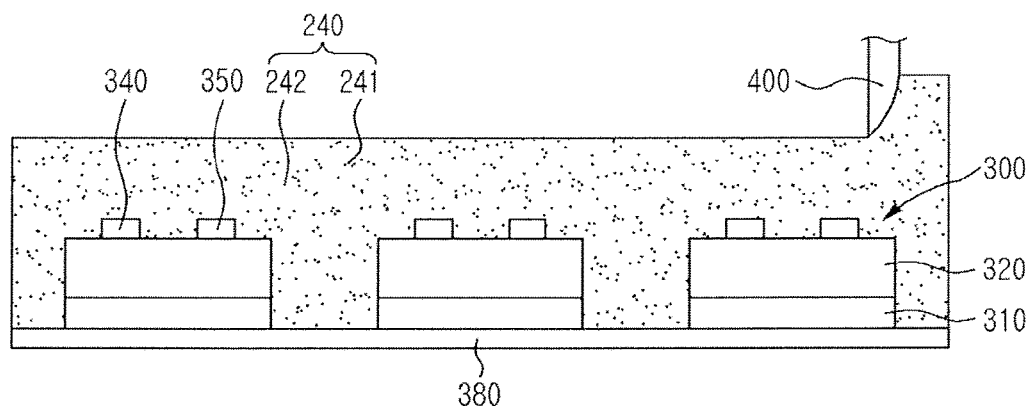

Thereafter, as illustrated in FIG. 12, a resin 242 including a highly reflective material 241 mixed therein is applied to form the reflective unit 240 integrally covering the plurality of light emitting elements 300 on the base film 380.

In detail, a predetermined amount of the resin 242 containing the highly reflective material 241 is injected to the base film 380 through a dispenser (not shown), or the like. The resin 242 may be injected to sufficiently cover the entirety of the plurality of light emitting elements 300.

In this manner, in the state in which the resin 242 is injected, the resin 242 may be pushed from one end of the base film 380 to the other end thereof by using a squeegee 400 or the like, to allow the resin 242 to be collectively applied to cover the respective light emitting elements 300 in a printed manner.

Since the resin 242 containing the highly reflective material 241 is collectively applied to the plurality of light emitting elements 300 through a single process according to the printing method, a process time can be shortened. However, the inventive concept is not limited thereto and the highly reflective material-mixed resin may be applied according to various other methods.

Figure 13:
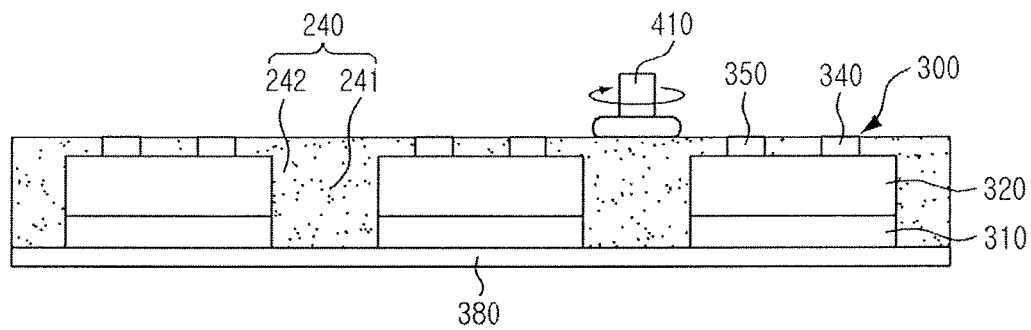

Thereafter, as illustrated in FIG. 13, an upper surface of the resin 242 formed on the light emitting element 300 is polished by using a polishing device 410, or the like, to allow the first connection electrode 340 and the second connection electrode 350 of the light emitting element 300 to be exposed.

Figure 14:
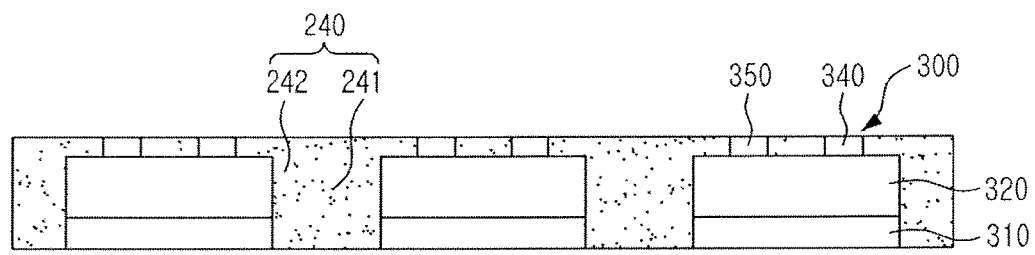

Thereafter, as illustrated in FIG. 14, the base film 380 formed under the light emitting element 300 with the exposed first connection electrode 340 and the second connection electrode 350 may be removed.

Figure 15:
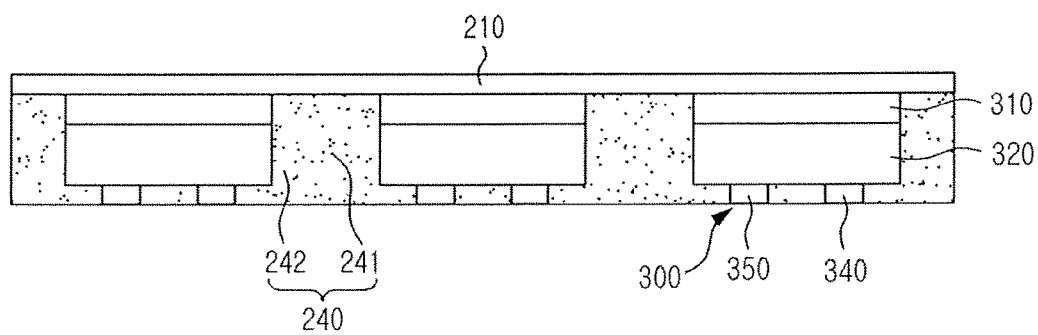

Thereafter, as illustrated in FIG. 15, the wavelength conversion unit 210 is formed on the portion from which the base film 380 was removed.

Accordingly, the wavelength conversion unit 210 may be formed to have a uniform thickness on a light emitting surface of the light emitting element 300. In the present embodiment, a case in which the wavelength conversion unit 210 is attached to the plurality of light emitting elements 300, as a film has been described, but the inventive concept is not limited thereto and the phosphor film (i.e., wavelength conversion unit) 210 may be cut at predetermined intervals according to a size of the light emitting element 300 with a cutting unit, and the cut wavelength conversion unit 210 may be individually attached to the light emitting elements 300.

Also, in an embodiment of the inventive concept, the method of attaching the wavelength conversion unit 210 as a light conversion layer for converting a wavelength of light generated by the light emitting element 300 has been described, but, obviously, the light conversion layer for converting a wavelength of light generated by the light emitting element 300 may be formed by using various methods such as a printing method, spray coating, electrophoresis, and the like.

Meanwhile, although not shown in FIG. 15, a protective film may be further formed on the surface of the wavelength conversion unit 210 in order to protect the light emitting element 300.

Figure 16:
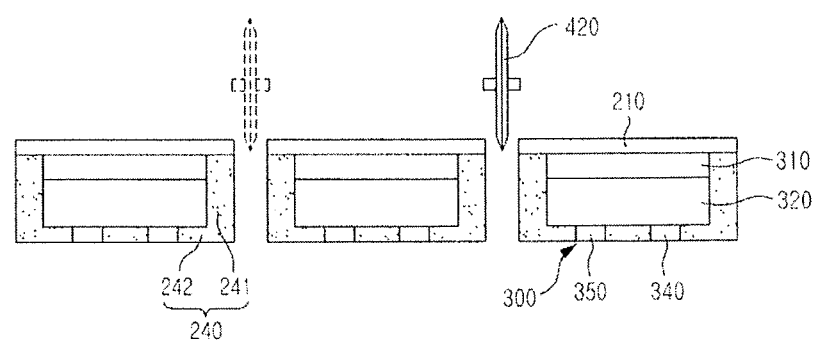

Thereafter, as illustrated in FIG. 16, the plurality of light emitting elements 300 with the wavelength conversion unit 210 attached thereto may be diced into individual light emitting elements. In detail, based on the respective light emitting elements 300, the reflective unit 240 and the wavelength conversion unit 210 between the respective light emitting elements 300 are cut to have a desired size by using a cutting device 420 so as to be separated into individual light emitting element packages.

Thereafter, the first external electrode 360 and the second external electrode 370 are formed to be connected to the first external electrode 360 and the second connection electrode 350, and extend in the lateral direction of the light emitting element to cover portions of the reflective unit 240. Then, the light emitting element package as illustrated in FIG. 6 is formed.

In the present embodiment, the case in which after the plurality of light emitting elements are separated into individual light emitting element packages, the first external electrode 360 and the second external electrode 370 are formed on the first connection electrode 340 and the second connection electrode 350, respectively, has been described, but the inventive concept is not limited thereto and the first external electrode 360 and the second external electrode 370 may first be formed and the plurality of light emitting elements may be subsequently separated into individual light emitting element packages.

Accordingly, the light emitting element package 200 including the reflective unit 240 formed to cover lateral surfaces of the light emitting element 300 and at least a portion of the first main surface of the light emitting element 300, the first connection electrode 340 and the second connection electrode 350 formed on the first main surface of the light emitting element 300, the first external electrode 360 and the second external electrode 370 formed to be connected to the first connection electrode 340 and the second connection electrode 350, respectively, and the wavelength conversion unit 210 formed on the second main surface of the light emitting element 300 is fabricated.

According to an embodiment of the inventive concept, since the relatively large first and second external electrodes may be formed in the light emitting element package 200, the light emitting element package 200 may be mounted on a wiring pattern without a circuit board, effectively dissipating heat generated by the light emitting element.

Figure 17:
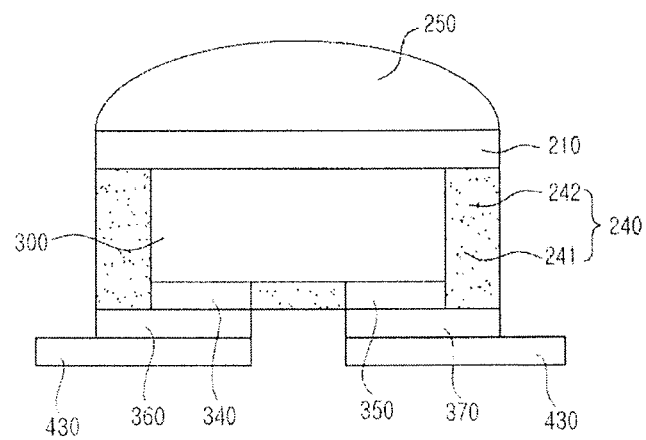

Thereafter, as illustrated in FIG. 17, if necessary, a lens 250 may be formed on an upper side of the plurality of light emitting elements 300 where the wavelength conversion unit 210 is formed. The lens 250 may serve to collect light emitted from the light emitting element or distribute light.

Through the foregoing fabrication method, the reflective unit, the electrode unit, and the wavelength conversion unit may be directly formed in the light emitting element to form a light emitting element package, and when the light emitting element package is mounted on a wiring pattern 430 without a circuit board, heat generated by the light emitting element can be more effectively dissipated.

Also, since the electrode unit and the wavelength conversion unit are directly formed in the light emitting element, a size of the light emitting element package can be minimized. Also, the structure of the light emitting element package can be more simplified to reduce the cost and enhance productivity.

Also, since light emitted laterally from the light emitting element is reflected by the reflective unit directly attached to the lateral surface of the chip, loss of light emitted from the light emitting element can be reduced.

As set forth above, according to embodiments of the inventive concept, the light emitting element package and the manufacturing method thereof capable of maximizing a degree of freedom in designing an illumination device and significantly reducing manufacturing costs by implementing an ultra-small package in which a package size equal to a chip size can be provided.

Also, according to an embodiment of the inventive concept, since the reflective unit, the electrode unit, and the wavelength conversion unit are directly formed in the light emitting element and the light emitting element package is directly connected to a wiring pattern, without being mounted on a circuit board, heat generated by the light emitting element can be more effectively dissipated.

In addition, according to an embodiment of the inventive concept, a size of the light emitting element package can be minimized by simplifying a structure thereof, thus reducing costs and enhancing productivity.

While the inventive concept has been shown and described in connection with the embodiments, it will be apparent to those skilled in the art that modifications and variations can be made without departing from the spirit and scope of the invention as defined by the appended claims.

What is claimed is:

1. A light emitting element package, comprising:
a light emitting element having a first main surface, a second main surface opposing the first main surface and a lateral surface connecting the first and second main surfaces;
a reflective unit covering the lateral surface and at least a portion of the first main surface of the light emitting element and reflecting light emitted from the light emitting element, the reflective unit having a reflective unit inner surface adjacent the lateral surface of the light emitting element and a reflective unit outer surface opposing the reflective unit inner surface;
a wavelength conversion unit covering the second main surface of the light emitting element and an upper surface of the reflective unit, the wavelength conversion unit having an inner main surface adjacent the second main surface of the light emitting element, an outer main surface opposing the inner main surface and a wavelength conversion unit lateral surface extending between the inner main surface and the outer main surface;
first and second connection electrodes disposed on the first main surface of the light emitting element and electrically connected to the light emitting element,
wherein the reflective unit outer surface and the wavelength conversion unit lateral surface are substantially coplanar along a direction orthogonal to an upper surface of the wavelength conversion unit, wherein the reflective unit outer surface and the wavelength conversion unit lateral surface form an outermost lateral surface of the light emitting element package,
wherein the light emitting element includes a substrate and a light emitting structure disposed on the substrate, and lateral surfaces of the substrate are covered by the reflective unit,
wherein bottom surfaces of the first and second connection electrodes are aligned with a bottom surface of the reflective unit; and
first and second external electrodes connected to the first and second connection electrodes, respectively, wherein a lateral surface of the first or second external electrodes is coplanar with the reflective unit outer surface and the wavelength conversion unit lateral surface along the direction orthogonal to the upper surface of the wavelength conversion unit.

2. The light emitting element package of claim 1, wherein the light emitting structure has a first conductivity-type semiconductor layer, an active layer, and a second conductivity-type semiconductor layer sequentially laminated therein.

3. The light emitting element package of claim 1, wherein the reflective unit includes a mixture of a highly reflective material and a curing resin.

4. The light emitting element package of claim 1, wherein the bottom surface of the reflective unit and bottom surfaces of the first and second connection electrodes are substantially coplanar.

5. The light emitting element package of claim 1, wherein the reflective unit inner surface is flat and extends along the direction orthogonal to the upper surface of the wavelength conversion unit.

6. The light emitting element package of claim 1, wherein inner surfaces of the first and second external electrodes are respectively substantially coplanar with inner surfaces of the first and second connection electrodes.

7. The light emitting element package of claim 1, wherein the first external electrode is in direct physical contact with the first connection electrode and the reflective unit, and the second external electrode is in direct physical contact with the second connection electrode and the reflective unit.

8. The light emitting element package of claim 1, further comprising a lens on the outer main surface of the wavelength conversion unit.

9. The light emitting element package of claim 1, wherein the reflective unit is not disposed on the wavelength conversion unit lateral surface.

10. A light emitting element package, comprising:
a light emitting element including a first main surface, a second main surface opposing the first main surface, and a lateral surface connecting the first and second main surfaces;
a reflective unit covering the lateral surface of the light emitting element and at least a portion of the first main surface and reflecting light emitted from the light emitting element, the reflective unit having a reflective unit inner surface adjacent the lateral surface of the light emitting element and a reflective unit outer surface opposing the reflective unit inner surface;
a wavelength conversion unit covering the second main surface of the light emitting element and an upper surface of the reflective unit, the wavelength conversion unit having an inner main surface adjacent the second main surface of the light emitting element, an outer main surface opposing the inner main surface and a wavelength conversion unit lateral surface extending between the inner main surface and the outer main surface; and
first and second connection electrodes disposed on the first main surface of the light emitting element and electrically connected to the light emitting element,
wherein an outermost surface of the reflective unit facing away from a side surface of the light emitting element and the wavelength conversion unit lateral surface are along a direction orthogonal to an upper surface of the wavelength conversion unit,
wherein the outermost surface of the reflective unit, and the wavelength conversion unit lateral surface form an outermost lateral surface of the light emitting element package,
wherein the light emitting element includes a substrate and a light emitting structure disposed on the substrate, and lateral surfaces of the substrate are covered by the reflective unit,
wherein bottom surfaces of the first and second connection electrodes are aligned with a bottom surface of the reflective unit, and
wherein outer surfaces of first and second external electrodes are substantially coplanar with the reflective unit outer surface and the wavelength conversion unit lateral surface.

11. The light emitting element package of claim 10, wherein the bottom surface of the reflective unit and bottom surfaces of the first and second connection electrodes are substantially coplanar.

12. The light emitting element package of claim 10, wherein the reflective unit inner surface is flat and extends along the direction orthogonal to the upper surface of the wavelength conversion unit.

13. A light emitting element package, comprising:
a light emitting element including a substrate and a light emitting structure disposed on the substrate, wherein the light emitting element has a bottom surface, an upper surface and a side surface connecting the bottom surface and the upper surface of the light emitting element;
a reflective unit disposed on the side surface of the light emitting element, wherein a first side surface of the reflective unit is disposed on the side surface of the light emitting element, and wherein a second side surface of the reflective unit faces away from the light emitting element;
a wavelength conversion unit disposed on the upper surface of the light emitting element and on an upper surface of the reflective unit;
a connection electrode disposed on the bottom surface of the light emitting element, wherein a bottom surface of the connection electrode is coplanar with a bottom surface of the reflective unit; and
an external electrode disposed on the connection electrode,
wherein a side surface of the external electrode, the second side surface of the reflective unit and a side surface of the wavelength conversion unit are substantially coplanar with each other along a direction orthogonal to an upper surface of the external electrode, and
wherein the side surface of the external electrode, the second side surface of the reflective unit and the side surface of the wavelength conversion unit define an outermost lateral surface of the light emitting element package.

14. The light emitting element package of claim 13, further comprising a lens disposed on the wavelength conversion unit.

15. The light emitting element package of claim 13, wherein the light emitting structure has a first conductivity-type semiconductor layer, an active layer, and a second conductivity-type semiconductor layer sequentially laminated therein.

* * * * *